(12) United States Patent
King et al.

(10) Patent No.: US 9,099,666 B2
(45) Date of Patent: Aug. 4, 2015

(54) ORGANIC LIGHT-EMITTING DEVICE

(71) Applicants: Cambridge Display Technology, Ltd., Godmanchester (GB); Sumitomo Chemical Company Limited, Tokyo (JP)

(72) Inventors: Simon King, Godmanchester (GB); David Mohamad, Godmanchester (GB)

(73) Assignees: Cambridge Display Technology, Ltd., Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 14/296,682

(22) Filed: Jun. 5, 2014

(65) Prior Publication Data
US 2014/0361274 A1    Dec. 11, 2014

(30) Foreign Application Priority Data

Jun. 5, 2013  (GB) .................................. 1310036.7

(51) Int. Cl.
| | | |
|---|---|---|
| *B05D 5/12* | (2006.01) | |
| *H01L 51/50* | (2006.01) | |
| *H01L 27/32* | (2006.01) | |
| *H01L 51/00* | (2006.01) | |
| *H01L 51/56* | (2006.01) | |

(52) U.S. Cl.
CPC ........ *H01L 51/5004* (2013.01); *H01L 27/3209* (2013.01); *H01L 51/0003* (2013.01); *H01L 51/504* (2013.01); *H01L 51/5016* (2013.01); *H01L 51/5056* (2013.01); *H01L 51/56* (2013.01); *H01L 2251/552* (2013.01)

(58) Field of Classification Search
CPC ............ H01L 51/0085; H01L 51/5016; H01L 51/0094; H01L 51/5052; Y10S 428/917
USPC .................................................. 313/506, 503
See application file for complete search history.

(56) References Cited

U.S. PATENT DOCUMENTS

2008/0145520 A1    6/2008 Yumoto

FOREIGN PATENT DOCUMENTS

| EP | 1 175 128 A2 | 1/2002 |
|---|---|---|
| EP | 1 175 128 A3 | 7/2002 |

OTHER PUBLICATIONS

Extended European Search Report for European Application No. 14170510.3 dated Oct. 8, 2014.

(Continued)

*Primary Examiner* — Thomas L Dickey
(74) *Attorney, Agent, or Firm* — Wolf, Greenfield & Sacks, P.C.

(57) ABSTRACT

An organic light-emitting device comprising an anode; a cathode; a first light-emitting layer between the anode and the cathode; and a second light-emitting layer between the first light-emitting layer and the cathode, wherein:
the first light-emitting layer comprises a hole-transporting material and a first phosphorescent material,
the second light-emitting layer comprises a second phosphorescent material; and
the lowest triplet excited state energy level of the hole-transporting material is: (a) lower than the lowest triplet excited state of the second phosphorescent material, and (b) the same as or higher than the lowest triplet excited state energy level of the first phosphorescent material.

17 Claims, 7 Drawing Sheets

(56) References Cited

OTHER PUBLICATIONS

Kimyonok et al., Norbornene-Based Copolymers with Iridium Complexes and Bis(carbazolyl)fluorene Groups in Their Side-Chains and Their Use in Light-Emitting Diodes. Chem Mater. 2007;19(23):5602-8.

Xiao et al., Recent progresses on materials for electrophosphorescent organic light-emitting devices. Adv Mater. Feb. 22, 2011;23(8):926-52. doi: 10.1002/adma.201003128. Epub Oct. 28, 2010.

ORGANIC LIGHT-EMITTING DEVICE

RELATED APPLICATIONS

This application claims foreign priority benefits under 35 U.S.C. §119(a)-(d) or 35 U.S.C. §365(b) of British application number 1310036.7, filed Jun. 5, 2013, the entirety of which is herein incorporated by reference.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

WO 2005/059921 discloses an organic light-emitting device comprising a hole-transporting layer and an electroluminescent layer comprising a host material and a phosphorescent material. High triplet energy level hole-transporting materials are disclosed in order to prevent quenching of phosphorescence.

WO 2010/119273 discloses an organic electroluminescent device having first and second electroluminescent layers including an electroluminescent layer comprising a hole-transporting material and an electroluminescent electron trapping material.

WO 2012/052713 discloses an organic light-emitting device having a charge-transporting layer doped with a light-emitting dopant and a light-emitting layer wherein the colour of light emitted from the device is wherein the x-coordinate value and/or the y-coordinate value of CIE(x,y) coordinates of light emitted from the device is no more than 0.1, and preferably no more than 0.05, from the respective x- or y-coordinate value of a control device in which the charge transporting layer is not doped with a light-emitting dopant.

SUMMARY OF THE INVENTION

In a first aspect, the invention provides an organic light-emitting device comprising an anode; a cathode; a first light-emitting layer between the anode and the cathode; and a second light-emitting layer between the first light-emitting layer and the cathode, wherein:
the first light-emitting layer comprises a hole-transporting material and a first phosphorescent material,
the second light-emitting layer comprises a second phosphorescent material; and
the lowest triplet excited state energy level of the hole-transporting material is: (a) lower than the lowest triplet excited state of the second phosphorescent material, and (b) the same as or higher than the lowest triplet excited state energy level of the first phosphorescent material.

In a second aspect the invention provides a method of forming an organic light-emitting device according to the first aspect, the method comprising the steps of forming the first light-emitting layer over the anode; forming the second light-emitting layer on the first light-emitting layer; and forming the cathode over the second light-emitting layer.

Optionally, the second phosphorescent material is a green or blue phosphorescent material.

DESCRIPTION OF THE DRAWINGS

The invention will now be described in more detail with reference to the drawings in which.

DETAILED DESCRIPTION OF THE INVENTION

Figure 1A:
FIG. 1A illustrates schematically a prior art OLED.

With reference to the prior art OLED of FIG. 1A, the OLED has a substrate 101, an anode 103, a hole-transporting layer 105, a light-emitting layer 107 and a cathode 109.

The hole-transporting layer 105 contains a hole-transporting material suitable for transporting holes to the light-emitting layer 107. In operation, light hv is emitted from the light-emitting layer 107.

Figure 1B:
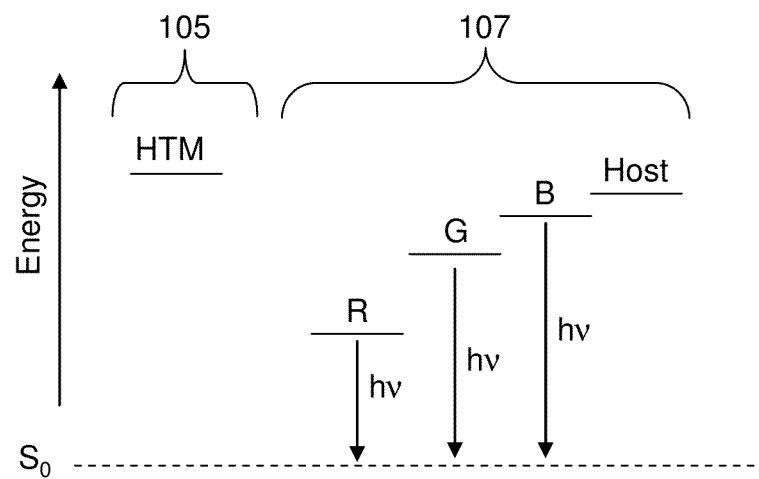
FIG. 1B illustrates energy levels of a comparative white OLED.

A white light emitting OLED may be formed using the structure illustrated in FIG. 1A. FIG. 1B is an energy diagram showing the lowest triplet excited state energy level T1 ("triplet energy level") of the components of the hole-transporting layer 105 and light-emitting layer 107. The triplet energy levels of the hole-transporting material HT and the host material Host are both higher than the triplet energy level of the blue phosphorescent material B, the green phosphorescent material G and the red phosphorescent material R.

The triplet energy level of hole-transporting material HT is selected to be higher than those of the phosphorescent materials in order to avoid quenching of phosphorescence, and resultant loss of efficiency, by either the hole-transporting material HT or by the host material Host.

Figure 2A:
FIG. 2A illustrates schematically an OLED according to an embodiment of the invention.

FIG. 2A illustrates an OLED according to an embodiment of the invention. The device has a substrate 201, an anode 203, a first light-emitting layer 205, a second light-emitting layer 107 and a cathode 109.

The first light-emitting layer 205 is an emissive hole-transporting layer 205 contains a hole-transporting material suitable for transporting holes to the second light-emitting layer 207 and a red phosphorescent material. The second light-emitting layer 207 contains green and blue phosphorescent materials and a host material. In operation, green and blue light emitted from second light-emitting layer 207 and red light emitted from emissive hole-transporting layer 105 combine to produce white light.

White-emitting OLEDs of embodiments of the invention may have a CIE x coordinate equivalent to that emitted by a black body at a temperature in the range of 2500-9000K and a CIE y coordinate within 0.05 or 0.025 of the CIE y coordinate of said light emitted by a black body, optionally a CIE x coordinate equivalent to that emitted by a black body at a temperature in the range of 2700-6000K.

Figure 2B:
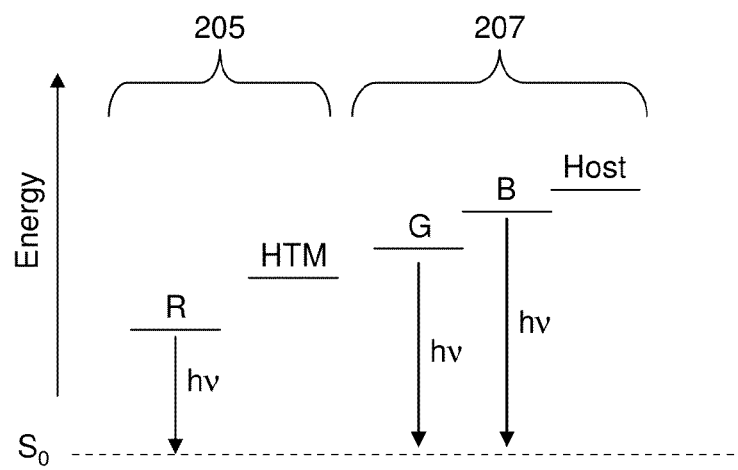
FIG. 2B illustrates the lowest excited state triplet energy levels for an OLED having the layer structure of FIG. 2A.

FIG. 2B is an energy diagram showing the triplet energy level of the components of the emissive hole-transporting layer 205 and second light-emitting layer 207 for a device having the structure of FIG. 2A.

The triplet energy level of the hole-transporting material HTM is lower than that of the blue phosphorescent material B and the green phosphorescent material G but higher than that of the red phosphorescent material R. It will be appreciated that the triplet energy level of HTM may be anywhere between that of R and G. In operation, red emission from the emissive hole-transporting layer 205 combines with green and blue emission from the second light-emitting layer 207 to produce white light.

In the case where the second light-emitting layer comprises a blue phosphorescent light-emitting material, either as the second or third phosphorescent material, the triplet energy level of the hole-transporting material as described anywhere herein is optionally at least 0.1 eV, optionally at least 0.2 eV, optionally at least 0.3 eV, optionally at least 0.4 eV lower than that of the blue phosphorescent light-emitting material. Optionally, the triplet energy level of the hole-transporting material is no more than 1 eV lower than, optionally no more than 0.8 eV lower than, the blue phosphorescent light-emitting material.

In another embodiment, the triplet energy level of the hole-transporting material HT may be lower than that of the blue phosphorescent material B but higher than that of the green phosphorescent material G and the red phosphorescent material R.

In the case where the second light-emitting layer comprises a green phosphorescent light-emitting material, the triplet energy level of the hole-transporting material as described anywhere herein is optionally at least 0.1 eV lower than that of the blue phosphorescent light-emitting material. Optionally, the triplet energy level of the hole-transporting material is no more than 0.5 eV lower than, optionally no more than 0.4 eV lower than, the green phosphorescent light-emitting material.

In a yet further embodiment, the second light-emitting layer may contain only one of the green and blue phosphorescent materials.

Triplet energy levels as described anywhere herein may be measured from the energy onset of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718). Preferably, triplet energy levels of host materials and hole-transporting materials as described herein are measured by low temperature phosphorescence spectroscopy. It will be appreciated that triplet energy levels of phosphorescent light-emitting materials may also be measured from their room temperature phosphorescence spectra.

It may be expected that the low triplet energy hole-transporting material HT will cause a reduction in efficiency due to quenching of phosphorescence from the blue or green phosphorescent material. However, the present inventors have found that the low triplet energy level of the hole-transporting material may not result in a reduction in efficiency if a phosphorescent material is provided in the hole-transporting layer 205. Without wishing to be bound by any theory, it is believed that triplet excitons that migrate into the hole-transporting layer 205 may be transferred to the red phosphorescent material R, either directly or via the hole-transporting material HT, thereby providing a luminescent decay path for those triplet excitons. Furthermore, the presence of red phosphorescent material R in the hole-transporting layer 205 may provide a luminescent decay path for triplet excitons that are formed in the hole-transporting layer 205.

Figure 2C:
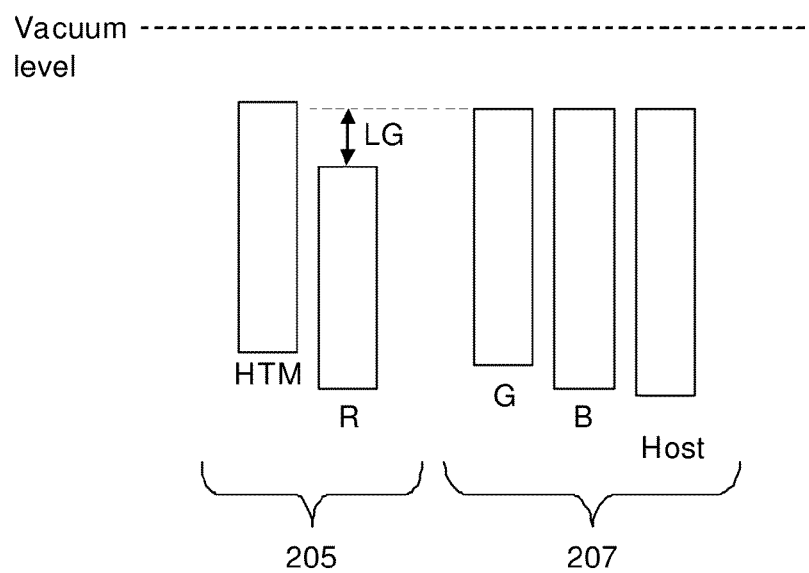
FIG. 2C illustrates the LUMO levels of an OLED having the layer structure of FIG. 2A.

FIG. 2C illustrates the HOMO and LUMO levels of the components of the hole-transporting layer 205 and second light-emitting layer 207 for an OLED having the structure of FIG. 2A in which the hole-transporting layer contains an electron-trapping phosphorescent material. The LUMO level of the red phosphorescent material R is deeper (further from vacuum level) than the LUMO levels of the components of the second light-emitting layer 207. By providing the red phosphorescent material R in the hole-transporting layer 205 rather than in the second light-emitting layer 207, trapping of electrons on the deep LUMO of the red phosphorescent material R is avoided. The LUMO gap LG between the phosphorescent material of the hole-transporting material and the LUMO level of the material having the deepest LUMO of the second light-emitting layer 207 may be in the range of about 0.05-0.30 eV. HOMO and LUMO levels as described anywhere herein may be measured by square wave voltammetry.

In the embodiments of FIG. 2B and FIG. 3 a red phosphorescent material is provided in the hole-transporting layer with green and blue phosphorescent material in the light-emitting layer, however it will be appreciated that the phosphorescent material in the hole-transporting layer 205 may contain any phosphorescent material having a triplet energy level lower than the triplet energy level of a phosphorescent material in the second light-emitting layer 207. For example, a yellow phosphorescent material may be provided in the hole-transporting layer and a green and/or blue phosphorescent material may be provided in the light-emitting layer. Preferably, the phosphorescent material in the hole-transporting layer 205 is different from the phosphorescent material or materials in the second light-emitting layer 207. Preferably, the phosphorescent material in the hole-transporting layer 205 emits light of a colour that is different from light emitted by the phosphorescent material or materials in the second light-emitting layer 207.

The phosphorescent material of the emissive hole-transporting layer may have a photoluminescence spectrum with a peak in the range of about more than 550 up to about 700, nm optionally in the range of about more than 560 nm or more than 580 nm up to about 630 nm or 650 nm.

A blue phosphorescent material of the second light-emitting layer may have a photoluminescence spectrum with a peak in the range of up to about 490 nm, optionally about 450-490 nm A green phosphorescent material of the second light-emitting layer may have a photoluminescence spectrum with a peak in the range of about more than 490 nm up to about 560 nm, optionally from about 500 nm, 510 nm or 520 nm up to about 560 nm.

The second light-emitting layer 207 may contain one, two or more phosphorescent materials, with the proviso that it contains at least one phosphorescent material having a triplet energy level higher than that of the phosphorescent material in the emissive hole-transporting layer 205, and higher than the triplet energy level of the hole-transporting material HT.

Substantially all light produced by the second light-emitting layer 207 may be phosphorescent light. Substantially all light produced by the device may be phosphorescent light.

One or more further layers may be provided between the anode and the cathode of the device of FIG. 2A. The device may contain one or more further layers between the anode and the light-emitting layer, for example layers selected from one or more of: a hole-injection layer between the anode and the hole-transporting layer; an electron transporting layer between the light-emitting layer and the cathode; a hole-blocking layer between the light-emitting layer and the cathode; and one or more further light-emitting layers. In a preferred embodiment a hole injection layer is provided between the anode and the hole-transporting layer. Preferably, the emissive hole-transporting layer 205 is adjacent to the second light-emitting layer 207.

The first light-emitting layer may have a thickness in the range of about 10-30 nm.

The second light-emitting layer may have a thickness in the range of about 40-100 nm.

Without wishing to be bound by any theory, it is believed that recombination of holes and electrons occurs at or close to an interface of hole-transporting layer 205 and second light-emitting layer 207 in embodiments wherein hole-transporting layer 205 and second light-emitting layer 207 are adjacent. The location of the recombination zone may be moved by inclusion of layers between the cathode and the second light-emitting layer, for example hole-blocking layers. In a preferred embodiment the second light-emitting layer is adjacent on one side to the hole-transporting layer 205 and adjacent on an opposing side to the cathode 109.

Host Material

The host material of the second light-emitting layer 207 may be a non-polymeric or polymeric material. The host material may have a triplet energy level that is the same as or higher than the triplet energy level or levels of the one or more phosphorescent materials of the second light-emitting layer 207.

The host material may be an electron-transporting material to provide for efficient transport of electrons from the cathode into the second light-emitting layer 207, either directly if the second light-emitting layer 207 is in direct contact with the cathode or, if present, via one or more intervening electron-transporting layers. The host material may have a LUMO level in the range of about −2.8 to −1.6 eV. HOMO and LUMO levels as described herein may be measured by square wave voltammetry. The first phosphorescent material may have a LUMO level at least 0.1 eV deeper than that of the host material, optionally 2.9 eV or deeper.

Host polymers include polymers having a non-conjugated backbone with charge-transporting groups pendant from the polymer backbone, and polymers having a conjugated backbone in which adjacent repeat units of the polymer backbone are conjugated together. A conjugated host polymer may comprise, without limitation, optionally substituted arylene repeat units, for example fluorene, phenylene, phenanthrene or dihydrophenanthrene repeat units; repeat units comprising heteroaryl groups; and/or conjugation-breaking repeat units.

The triplet energy level of a conjugated host polymer may be controlled, at least in part, by use of repeat units that limit the extent of conjugation along the polymer backbone, for example by providing a conjugation-reducing unit in the polymer backbone, such as a twisting unit, to reduce the extent of conjugation between repeat units on either side of the conjugation-reducing unit without completely breaking conjugation between those adjacent units, and/or by providing conjugation-breaking repeat units that completely break conjugation between repeat units either side of the conjugation-breaking repeat unit.

Exemplary phenylene repeat units may have formula (III):

wherein q in each occurrence is independently 0, 1, 2, 3 or 4, optionally 1 or 2; n is 1, 2 or 3; and $R^3$ independently in each occurrence is a substituent.

Where present, each $R^3$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —$(Ar^3)_r$ wherein each $Ar^3$ is independently an aryl or heteroaryl group and r is at least 2, preferably a branched or linear chain of phenyl groups each of which may be unsubstituted or substituted with one or more $C_{1-20}$ alkyl groups; and
- a crosslinkable-group, for example a group comprising a double bond such and a vinyl or acrylate group, or a benzocyclobutane group.

In the case where $R^3$ comprises an aryl or heteroaryl group, or a linear or branched chain of aryl or heteroaryl groups, the or each aryl or heteroaryl group may be substituted with one or more substituents $R^7$ selected from the group consisting of:

alkyl, for example $C_{1-20}$ alkyl, wherein one or more non-adjacent C atoms may be replaced with O, S, substituted N, C=O and —COO— and one or more H atoms of the alkyl group may be replaced with F;

$NR^9_2$, $OR^9$, $SR^9$, $SiR^9_3$ and fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^9$— wherein $R^9$ is as described above.

Preferably, each $R^3$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (III) include the following:

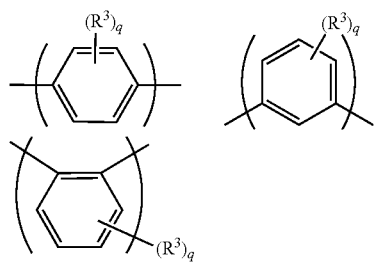

A particularly preferred repeat unit of formula (III) has formula (IIIa):

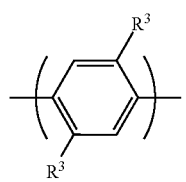

(IIIa)

Substituents $R^3$ of formula (IIIa) are adjacent to linking positions of the repeat unit, which may cause steric hindrance between the repeat unit of formula (IIIa) and adjacent repeat units, resulting in the repeat unit of formula (IIIa) twisting out of plane relative to one or both adjacent repeat units.

Exemplary repeat units where n is 2 or 3 include the following:

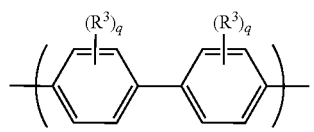

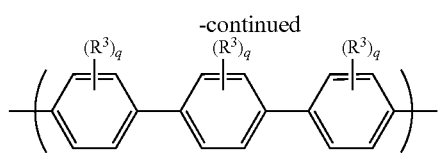

A preferred repeat unit has formula (IIIb):

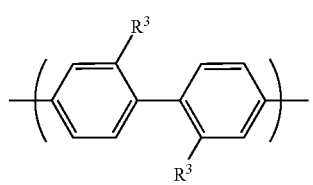

(IIIb)

The two $R^3$ groups of formula (IIIb) may cause steric hindrance between the phenyl rings they are bound to, resulting in twisting of the two phenyl rings relative to one another.

A further class of arylene repeat units is optionally substituted fluorene repeat units, such as repeat units of formula (IV):

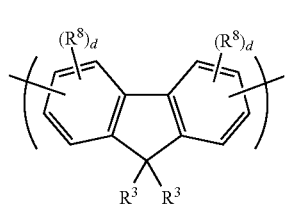

(IV)

wherein $R^3$ in each occurrence is the same or different and is a substituent as described with reference to formula (III), and wherein the two groups $R^3$ may be linked to form a ring; $R^8$ is a substituent; and d is 0, 1, 2 or 3.

The aromatic carbon atoms of the fluorene repeat unit may be unsubstituted, or may be substituted with one or more substituents $R^8$. Exemplary substituents $R^8$ are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Substituted N, where present, may be —$NR^5$— wherein $R^5$ is $C_{1-20}$ alkyl; unsubstituted phenyl; or phenyl substituted with one or more $C_{1-20}$ alkyl groups.

The extent of conjugation of repeat units of formula (IV) to aryl or heteroaryl groups of adjacent repeat units may be controlled by (a) linking the repeat unit through the 3- and/or 6-positions to limit the extent of conjugation across the repeat unit, and/or (b) substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3-and 6-positions.

The repeat unit of formula (IV) may be an optionally substituted 2,7-linked repeat unit of formula (IVa):

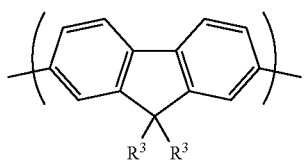
(IVa)

Optionally, the repeat unit of formula (IVa) is not substituted in a position adjacent to the 2- or 7-position. Linkage through the 2- and 7-positions and absence of substituents adjacent to these linking positions provides a repeat unit that is capable of providing a relatively high degree of conjugation across the repeat unit.

The repeat unit of formula (IV) may be an optionally substituted 3,6-linked repeat unit of formula (IVb)

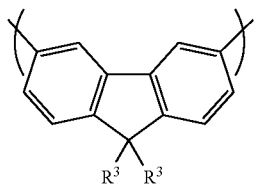
(IVb)

The extent of conjugation across a repeat unit of formula (IVb) may be relatively low as compared to a repeat unit of formula (IVa).

Another exemplary arylene repeat unit has formula (V):

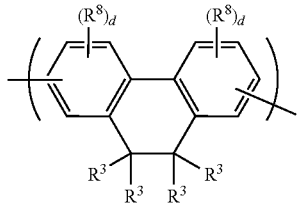
(V)

wherein $R^3$, $R^8$ and d are as described with reference to formula (III) and (IV) above. Any of the $R^3$ groups may be linked to any other of the $R^3$ groups to form a substituted or unsubstituted ring. Aromatic carbon atoms of the repeat unit of formula (V) may be unsubstituted, or may be substituted with one or more substituents.

Repeat units of formula (V) may have formula (Va) or (Vb):

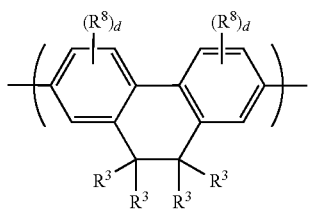
(Va)

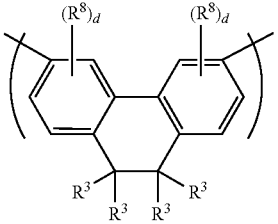
(Vb)

The host polymer may contain triazine-containing repeat units. Exemplary triazine-containing repeat units have formula (VIII):

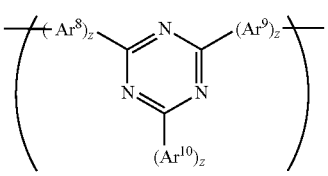
(VIII)

wherein $Ar^8$, $Ar^9$ and $Ar^{10}$ are independently selected from substituted or unsubstituted aryl or heteroaryl, and z in each occurrence is independently at least 1, optionally 1, 2 or 3, preferably 1.

Any of $Ar^8$, $Ar^9$ and, if present, $Ar^{10}$ may be substituted with one or more substituents. Exemplary substituents are substituents $R^{10}$, wherein each $R^{10}$ may independently be selected from the group consisting of:
- substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and
- a crosslinkable group attached directly to $Ar^8$, $Ar^9$ or $Ar^{10}$ or spaced apart therefrom by a spacer group, for example a group comprising a double bond such and a vinyl or acrylate group, or a benzocyclobutane group.

Preferably, $Ar^8$, $Ar^9$ and $Ar^{10}$ of formula (VIII) are each phenyl, each phenyl independently being unsubstituted or substituted with one or more $C_{1-20}$ alkyl groups.

$Ar^{10}$ of formula (VIII) is preferably phenyl, and is optionally substituted with one or more $C_{1-20}$ alkyl groups or a crosslinkable unit.

A particularly preferred repeat unit of formula (VIII) has formula (VIIIa), which may be unsubstituted or substituted with one or more substituents $R^{10}$, preferably one or more $C_{1-20}$ alkyl groups:

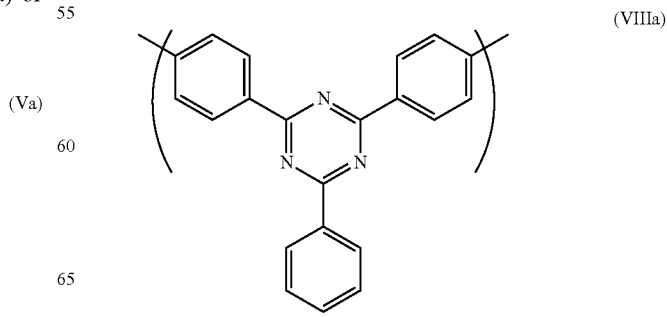
(VIIIa)

Exemplary conjugation-breaking repeat units include repeat units of formula $$—(Ar^7\text{-}Sp^1\text{-}Ar^7)—\qquad (IX)$$

wherein $Ar^7$ independently in each occurrence represents an aromatic or heteroaromatic group that may be unsubstituted or substituted with one or more substituents, and $Sp^1$ represents a spacer group comprising at least one $sp^3$ hybridised carbon atom separating the two groups $Ar^7$. Preferably, each $Ar^7$ is phenyl and $Sp^1$ is a spacer group and containing at least one $sp^3$-hybridised carbon atom spacing the two groups $Ar^7$ from each other, optionally a $C_{1-10}$ alkyl group wherein one or more non-adjacent C atoms of the $C_{1-10}$ alkyl group may be replaced with O, S, C=O or COO. Substituents for $Ar^7$ may be selected from groups $R^1$ described above with reference to formula (III), and are preferably selected from $C_{1-20}$ alkyl.

Hole-Transporting Material

The hole-transporting material of the emissive hole-transporting layer 205 may be a non-polymeric or polymeric material. Exemplary hole transporting materials may have a electron affinity of −2.9 eV or lower (i.e. closer to vacuum level) and an ionisation potential of −5.8 eV or lower, preferably −5.7 eV or lower.

Hole-transporting polymers include conjugated and non-conjugated polymers. A conjugated hole-transporting polymer may comprise repeat units of formula (VII):

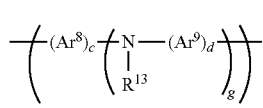

(VII)

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{10}$, a branched or linear chain of $Ar^{10}$ groups, or a crosslinkable unit that is bound directly to the N atom of formula (VII) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{10}$ in the repeat unit of Formula (VII) may be linked by a direct bond or a divalent linking atom or group to another of $Ar^8$, $Ar^9$ and $Ar^{10}$.

Preferred divalent linking atoms and groups include O, S; substituted N; and substituted C.

Preferred repeat units of formula (VII) have formulae 1-3:

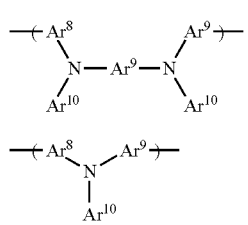

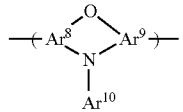

In one preferred arrangement, $R^{13}$ is $Ar^{10}$ and each of $Ar^8$, $Ar^9$ and $Ar^{10}$ are independently and optionally substituted with one or more $C_{1-20}$ alkyl groups. $Ar^8$, $Ar^9$ and $Ar^{10}$ are preferably phenyl.

In another preferred arrangement, the central $Ar^9$ group of formula (1) linked to two N atoms is a polycyclic aromatic that may be unsubstituted or substituted with one or more substituents $R^{10}$. Exemplary polycyclic aromatic groups are naphthalene, perylene, anthracene and fluorene.

In another preferred arrangement, $Ar^8$ and $Ar^9$ are phenyl, each of which may be substituted with one or more $C_{1-20}$ alkyl groups, and $R^{13}$ is —$(Ar^{10})_r$, wherein r is at least 2 and wherein the group —$(Ar^{10})_r$, forms a linear or branched chain of aromatic or heteroaromatic groups, for example 3,5-diphenyl-benzene wherein each phenyl may be substituted with one or more $C_{1-20}$ alkyl groups. In another preferred arrangement, c, d and g are each 1 and $Ar^8$ and $Ar^9$ are phenyl linked by an oxygen atom to form a phenoxazine ring.

A hole-transporting polymer comprising repeat units of formula (VII) may be a homopolymer or a copolymer containing repeat units of formula (VII) and one or more co-repeat units. Exemplary co-repeat units include arylene repeat units that may be unsubstituted or substituted with one or more substituents, for example one or more $C_{1-40}$ hydrocarbyl groups. Exemplary arylene repeat units include repeat units (III), (IV) and (V) described above.

In the case of a copolymer, repeat units of formula (VII) may be provided in a molar amount in the range of about 10 mol % up to about 95 mol %, optionally about 10-75 mol % or about 10-50 mol %.

The hole-transporting polymer may contain one, two or more different repeat units of formula (VII).

The hole-transporting polymer may contain crosslinkable groups that may be crosslinked following deposition of the hole-transporting polymer to form an insoluble, crosslinked hole-transporting layer prior to formation of the second light-emitting layer. Crosslinkable groups may be provided as substituents of any repeat units of the polymer, for example any of repeat units (III), (IV), (V) or (VII) that may be present in the hole-transporting polymer.

Charge-transporting and/or light-emitting polymers as described anywhere herein are suitably amorphous polymers.

Phosphorescent Materials

Phosphorescent materials of the emissive hole-transporting layer 205 and the second light-emitting layer 207 may be selected from phosphorescent transition metal complexes, with the proviso that the phosphorescent material of the hole-transporting layer 205 has a triplet energy level that is lower than the triplet energy level of a phosphorescent material in the second light-emitting layer 207.

Exemplary phosphorescent transition metal complexes have formula (IX):

$$ML^1{}_qL^2{}_rL^3{}_s \qquad (IX)$$

wherein M is a metal; each of $L^1$, $L^2$ and $L^3$ is a coordinating group; q is a positive integer; r and s are each independently 0 or a positive integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (X):

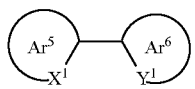

(X)

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

To achieve red emission, $Ar^5$ may be selected from phenyl, fluorene, naphthyl and $Ar^6$ are selected from quinoline, isoquinoline, thiophene and benzothiophene.

To achieve green emission, $Ar^5$ may be selected from phenyl or fluorene and $Ar^6$ may be pyridine.

To achieve blue emission, $Ar^5$ may be selected from phenyl and $Ar^6$ may be selected from imidazole, pyrazole, triazole and tetrazole.

Examples of bidentate ligands are illustrated below:

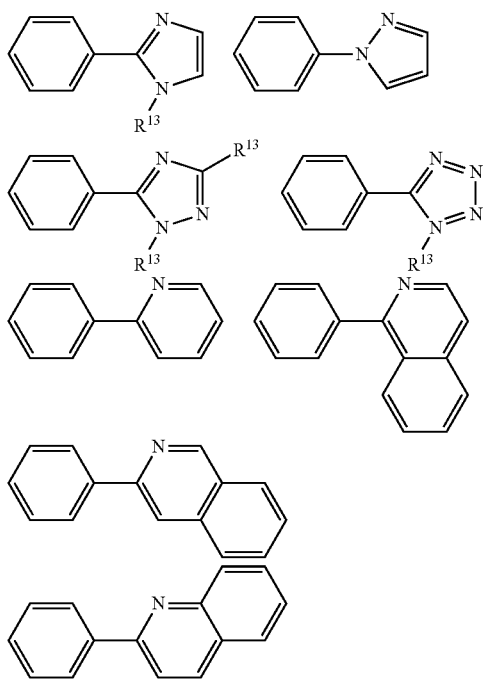

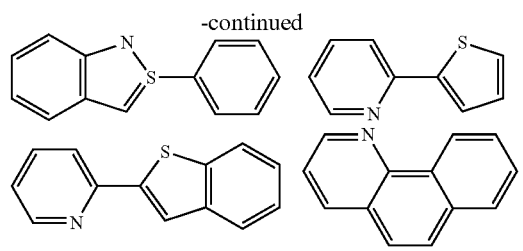

-continued

Each of $Ar^y$ and $Ar^6$ may carry one or more substituents. Two or more of these substituents may be linked to form a ring, for example an aromatic ring.

Other ligands suitable for use with d-block elements include diketonates, in particular acetylacetonate (acac), tetrakis-(pyrazol-1-yl)borate, 2-carboxypyridyl, triarylphosphines and pyridine, each of which may be substituted.

Exemplary substituents include groups $R^{13}$ as described above with reference to Formula (VII). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; and dendrons which may be used to obtain or enhance solution processability of the metal complex, for example as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

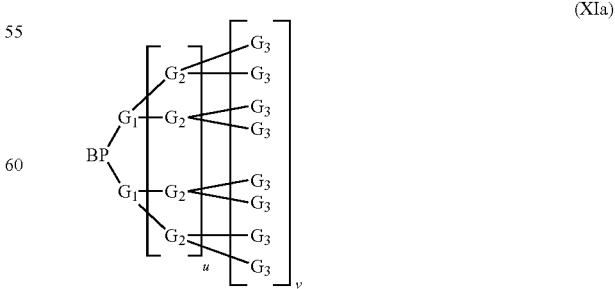

(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1, G_2 \ldots G_n$ is phenyl, and each phenyl BP, $G_1, G_2 \ldots G_{n-1}$ is a 3,5-linked phenyl.

A preferred dendron is a substituted or unsubstituted dendron of formula (XIb):

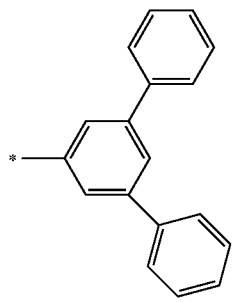

(XIb)

wherein * represents an attachment point of the dendron to a core.

BP and/or any group G may be substituted with one or more substituents, for example one or more $C_{1-20}$ alkyl or alkoxy groups.

The phosphorescent material of the hole-transporting layer may be covalently bound to the hole-transporting material or it may be mixed with the hole-transporting material.

The or each phosphorescent material of the second light-emitting layer may be covalently bound to a host material of the second light-emitting layer or may be mixed with the host material.

If the hole-transporting material or host material is a polymer then the phosphorescent material may be a repeat unit in the polymer backbone, provided as an end-group of the polymer, or provided in a side-chain of the polymer. If the phosphorescent material is provided as a side-chain then it may be directly bound to a repeat unit in the backbone of the polymer or it may be spaced apart from the polymer backbone by a spacer group.

Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C=O or COO. A phosphorescent material of the hole-transporting layer or the second light-emitting layer, and optional spacer, may be provided as a substituent $R^3$ of any of repeat units of formulae (III), (IV) or (V) described above that may be present in a hole-transporting polymer or host polymer, respectively.

Covalent binding of the phosphorescent material to the hole-transporting material may reduce or avoid washing of the phosphorescent material out of the hole-transporting layer if an overlying light-emitting layer is deposited from a formulation of the light-emitting layer materials in a solvent or solvent mixture.

If the hole-transporting material and phosphorescent material of the hole-transporting layer are mixed in a hole-transporting layer then the phosphorescent material may be provided in an amount in the range of 0.1-20 weight %, optionally 0.1-5 mol % of the hole-transporting material/phosphorescent material mixture.

If the phosphorescent material of the hole-transporting layer is covalently bound to a hole-transporting polymer then repeat units comprising the phosphorescent material, or an end unit comprising the phosphorescent material, may form 0.1-20 mol %, optionally 0.1-5 mol % of the polymer.

If the host material and the or each phosphorescent material of the second light-emitting layer are mixed then the or each phosphorescent material may be provided in an amount in the range of 0.1-50 weight % of the host and phosphorescent emitter(s). Where present, a blue phosphorescent material may be provided in an amount in the range of 10-50 weight % of the host and phosphorescent emitter(s). Where present, a green phosphorescent material may be provided in an amount in the range of 0.1-10 weight % of the host and phosphorescent emitter(s).

If the phosphorescent material or materials of the second light-emitting layer are covalently bound to a host polymer then repeat units comprising the phosphorescent material, or an end unit comprising the phosphorescent material, may form 0.1-50 mol of the polymer.

If two or more phosphorescent materials are provided in the second light emitting layer then the phosphorescent material with the highest triplet energy level is preferably provided in a larger weight percentage than the lower triplet energy level material or materials.

HOMO and LUMO Level Measurement

HOMO and LUMO levels as described anywhere herein may be measured by square wave voltammetry.

The working electrode potential may be ramped linearly versus time. When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/ or tertbutyl ammonium hexafluorophosphate solution in acetonitrile, a glassy carbon working electrode where the sample is coated as a film, a platinum counter electrode (donor or acceptor of electrons) and a reference glass electrode no leak Ag/AgCl. Ferrocene is added in the cell at the end of the experiment for calculation purposes.

Measurement of the difference of potential between Ag/AgCl/ferrocene and sample/ferrocene.

Method and Settings:

3 mm diameter glassy carbon working electrode

Ag/AgCl/no leak reference electrode

Pt wire auxiliary electrode 0.1M tetrabutylammonium hexafluorophosphate in acetonitrile LUMO=4.8−ferrocene(peak to peak maximum average)+onset Sample: 1 drop of 5 mg/mL in toluene spun at 3000 rpm LUMO (reduction) measurement:

A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline. HOMO and LUMO values may be measured at ambient temperature.

Hole Injection Layers

A conductive hole injection layer, which may be formed from a conductive organic or inorganic material, may be provided between the anode 203 and the emissive hole-transporting layer 205. Examples of conductive organic materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode 209 is selected from materials that have a workfunction allowing injection of electrons into the second light-emitting layer 207 of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming the emissive hole-transporting layer or the second light-emitting layer may be formed from the components forming those layers and one or more suitable solvents.

The formulation may be a solution of the polymer and any other components in the one or more solvents, or may be a dispersion in the one or more solvents in which one or more components are not dissolved. Preferably, the formulation is a solution.

Exemplary solvents include benzenes substituted with one or more substituents selected from $C_{1-10}$ alkyl and $C_{1-10}$ alkoxy groups, for example toluene, xylenes and methylanisoles.

Particularly preferred solution deposition techniques including printing and coating techniques such spin-coating and inkjet printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

EXAMPLES

Materials

All polymers as described herein were formed by Suzuki polymerisation as described in WO 00/53656 using monomers selected from monomers below:

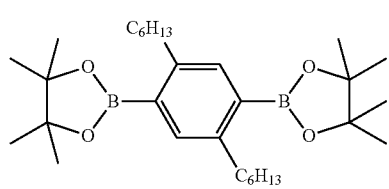

Monomer 1

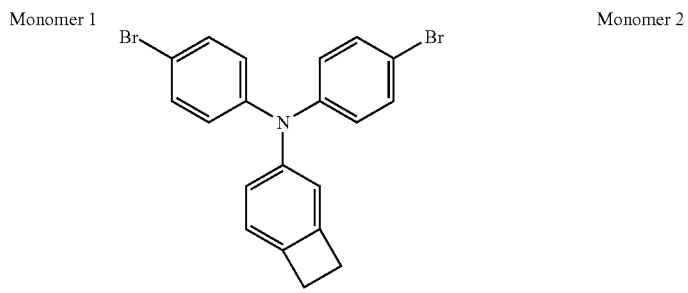

Monomer 2

-continued
Monomer 3
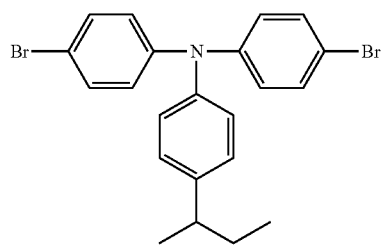
Monomer 4
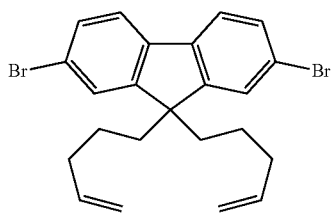
Monomer 5
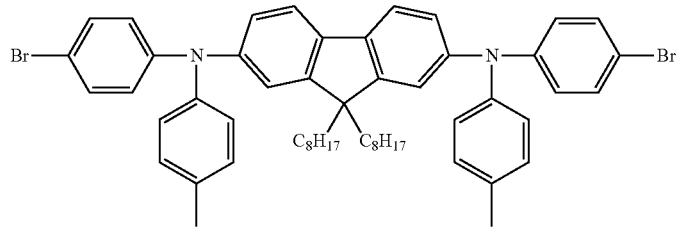
Monomer 6
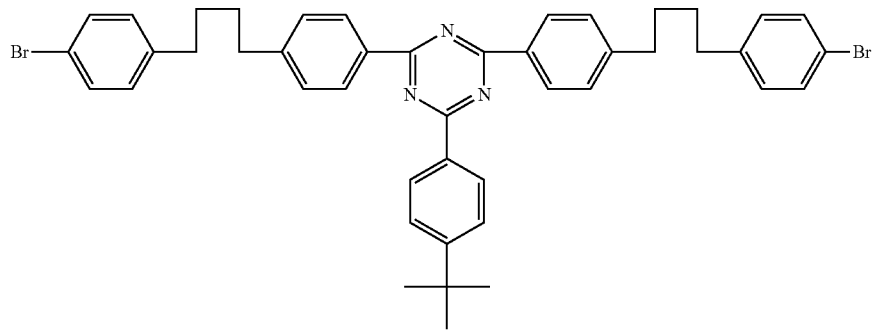
Monomer 7
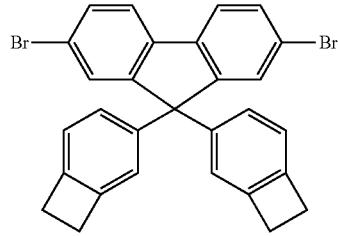
Monomer 8
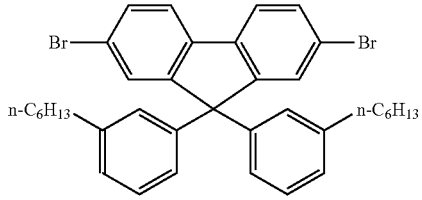
Monomer 9
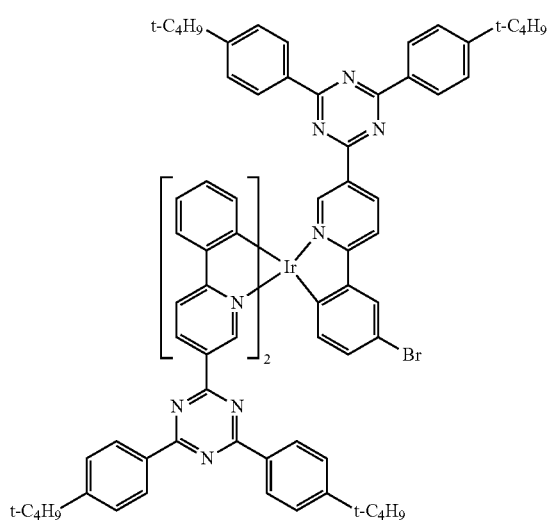
Monomer 10
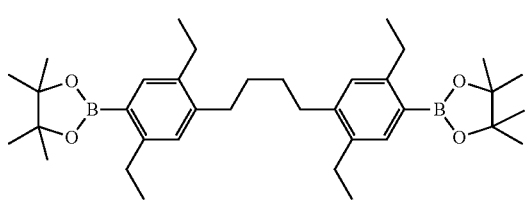

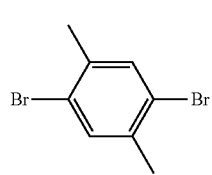 Monomer 11
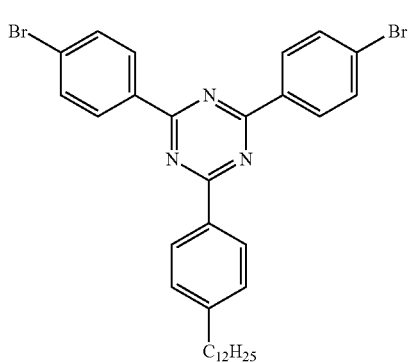 Monomer 12
Phosphorescent materials of the light-emitting layer were selected from the following monomers:
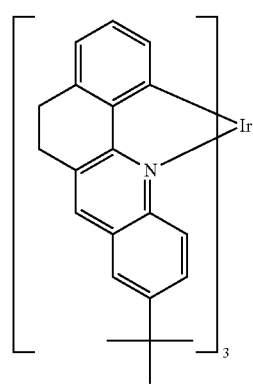 Red Emitter 1
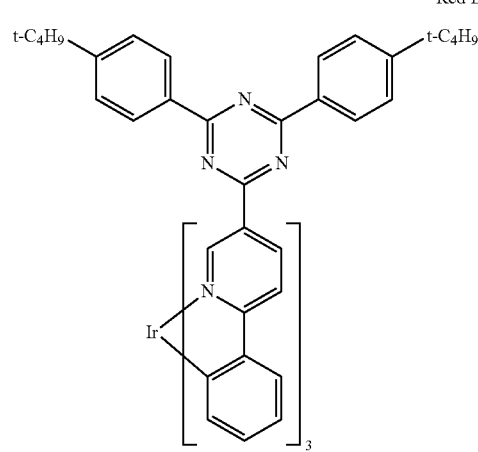 Red Emitter 2
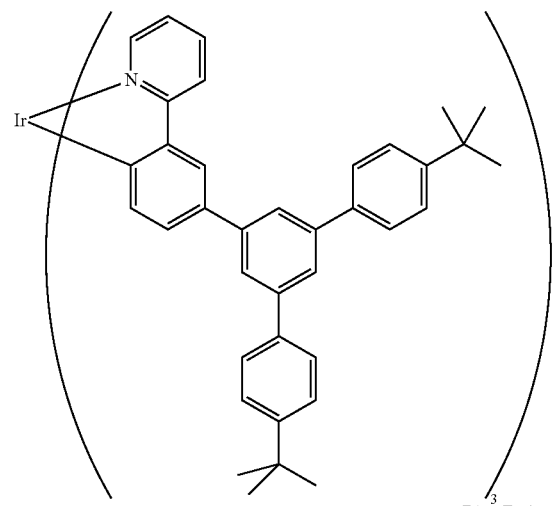 Green Emitter 1
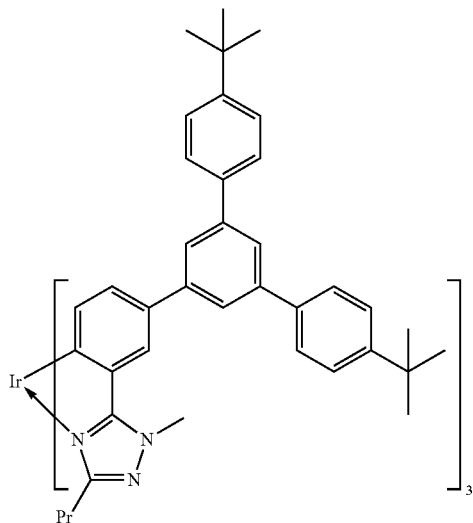 Blue Emitter 1

General Device Process

Organic light-emitting devices having the following structure were prepared:
ITO/HIL/HTL/LE/Cathode wherein ITO is an indium-tin oxide anode; HIL is a hole-injecting layer, HTL is a hole-transporting layer (that may or may not be emissive) and LE is a light-emitting layer.

A substrate carrying ITO was cleaned using UV/Ozone. The hole injection layer was formed by spin-coating an aqueous formulation of a hole-injection material available from Plextronics, Inc. A hole transporting layer was formed to a thickness of 22 nm by spin-coating a hole-transporting polymer (that may or may not be emissive) and crosslinking the polymer by heating. A light-emitting layer was formed to a thickness of 75 nm by spin-coating a light-emitting composition of a host polymer and phosphorescent light-emitting compounds.

A cathode was formed by evaporation of a first layer of a metal fluoride to a thickness of about 2 nm, a second layer of aluminium to a thickness of about 200 nm and an optional third layer of silver.

Example 1

Effect of Low Triplet Energy Hole-Transporting Layer

To investigate the effect of a low triplet energy hole-transporting layer, devices containing a non-emissive hole-transporting layer and a white light-emitting layer were prepared.

In one example a high triplet energy hole-transporting polymer (High T1 HTM) was used; in another example, a low triplet energy hole-transporting polymer (Low T1 HTM) was used.

High T1 HTM was prepared by Suzuki polymerisation as described in WO 00/53656 of the following monomers:

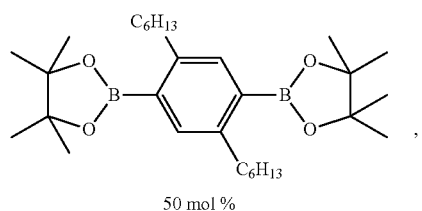

Monomer 1

50 mol %

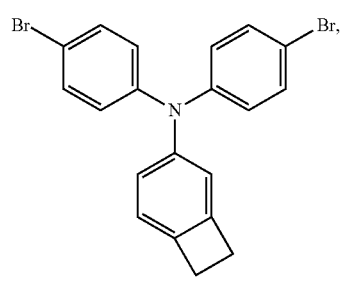

Monomer 2

35 mol %

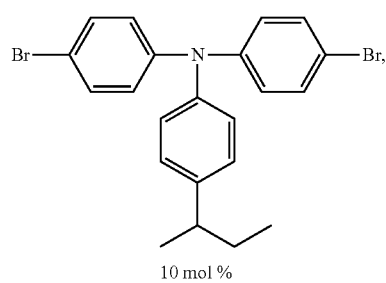

Monomer 3

10 mol %

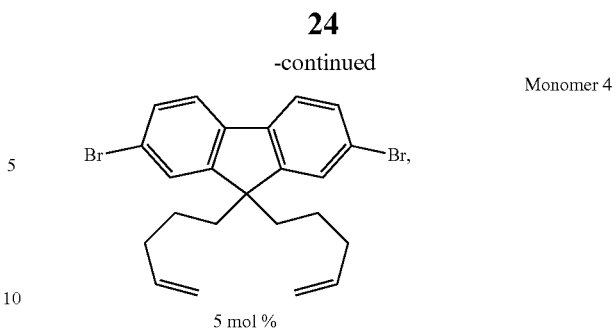

Monomer 4

5 mol %

The lowest excited state triplet energy level of the High T1 HTM is 2.52 eV.

Low T1 HTM was prepared by Suzuki polymerisation as described in WO 00/53656 of the following monomers:

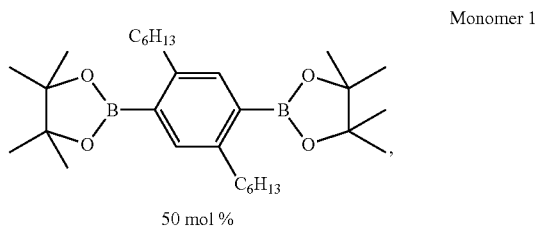

Monomer 1

50 mol %

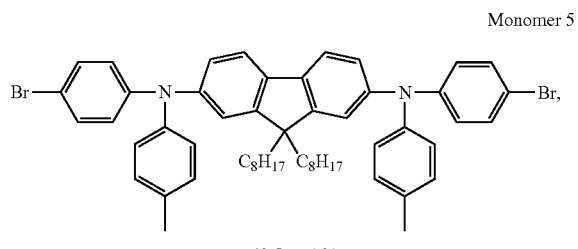

Monomer 5

42.5 mol %

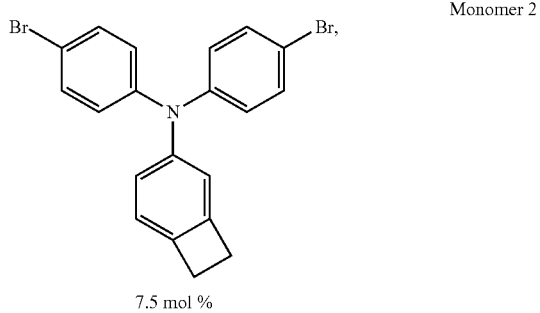

Monomer 2

7.5 mol %

The lowest excited state triplet energy level of the Low T1 HTM is 2.17 eV.

The T1 values of the hole-transporting polymers were measured by low temperature phosphorescence spectroscopy.

Two devices were prepared according to the General Device Process—one in which the hole-transporting layer was formed Low T1 HTM, and one in which the hole-transporting layer was formed using High T1 HTM.

The light-emitting layer of both devices was formed from a composition as set out in Table 1. The monomers listed for Host Polymer 1 in Table 1 are the monomers used to form the polymer by Suzuki polymerisation as described in WO 00/53636. LUMO levels were measured by square wave voltammetry.

TABLE 1

| Material | Weight ratio (%) | LUMO (eV) |
|---|---|---|
| Host Polymer 1 | | |
| Monomer 1, 50 mol % | 61.3 | −1.8 |
| Monomer 6, 50 mol % | | |
| Blue Phosphorescent Emitter 1. | 36.1 | −1.88 |
| Green Phosphorescent Emitter 1 | 1.5 | −2.2 |
| Red Phosphorescent Emitter 1 | 1.2 | −2.49 |

Figure 3A:
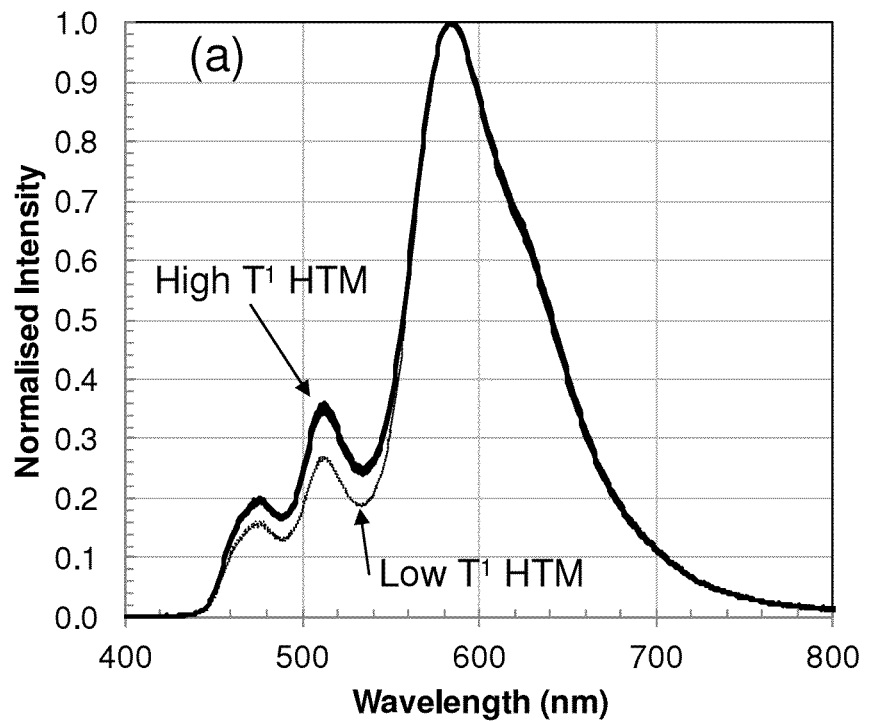
FIG. 3A shows the electroluminescent spectra of two white-emitting OLEDs, each OLED containing a white light-emitting layer and a non-emissive hole-transporting layer, wherein the hole-transporting material of one device is relatively high and wherein the hole-transporting material of the other device is relatively low.
Figure 3B:
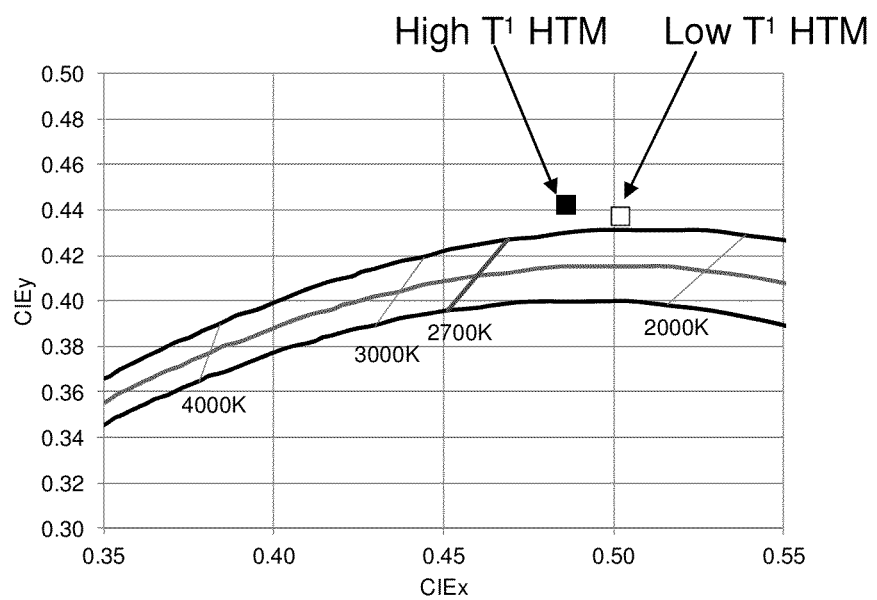
FIG. 3B shows plots of the CIE co-ordinates of the two devices described with reference to FIG. 3A.

With reference to FIGS. 3A and 3B respectively it can be seen that the electroluminescent spectra and CIE co-ordinates of the two devices are similar.

Figure 3C:
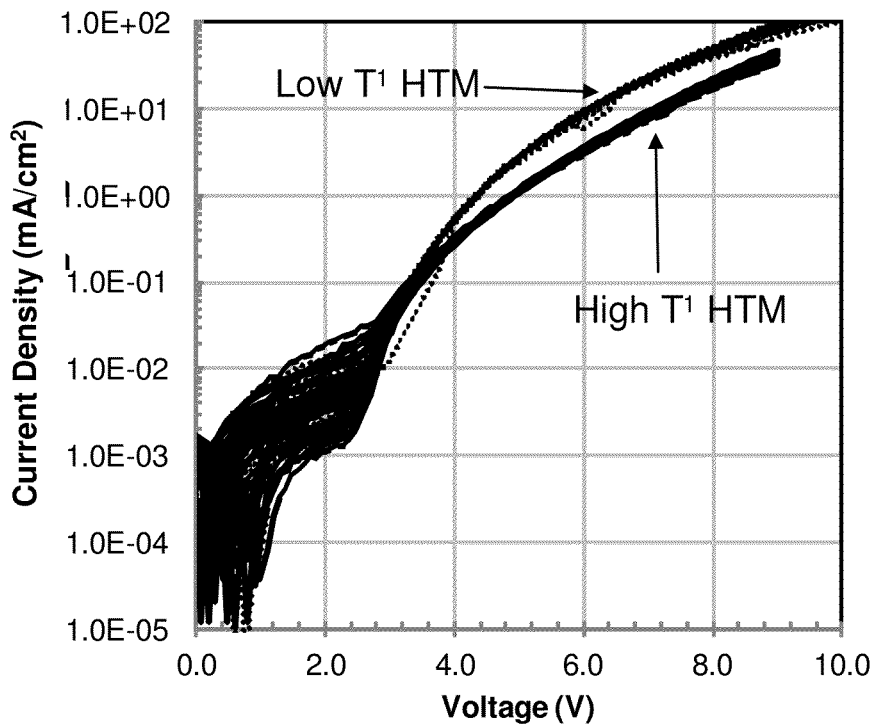
FIG. 3C shows plots of current density vs. external quantum efficiency for the two devices described with reference to FIG. 3A.
Figure 3D:
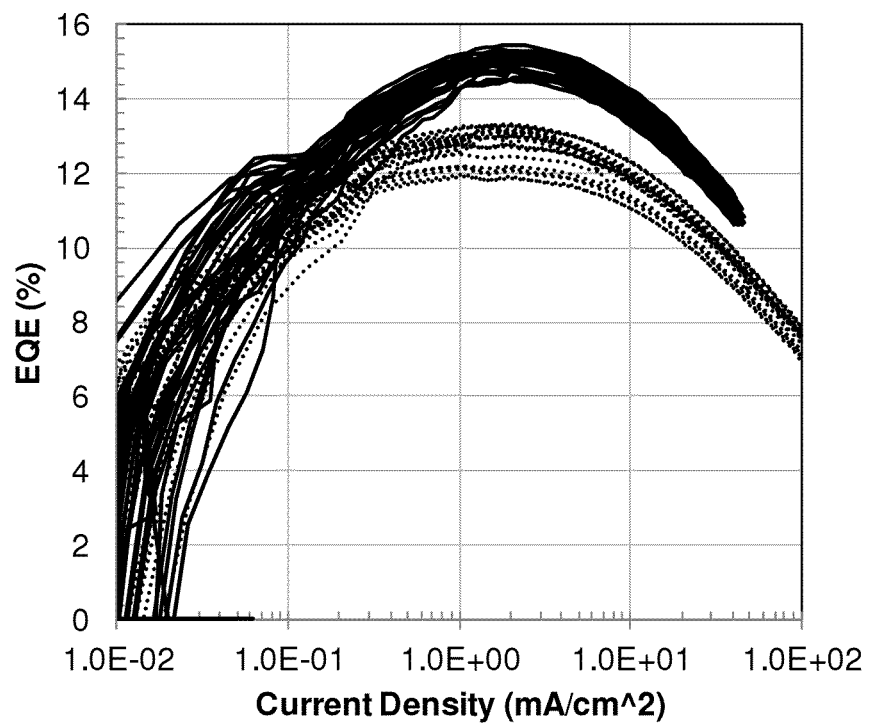
FIG. 3D shows plots of current density vs. voltage for the two devices described with reference to FIG. 3A.
Figure 3E:
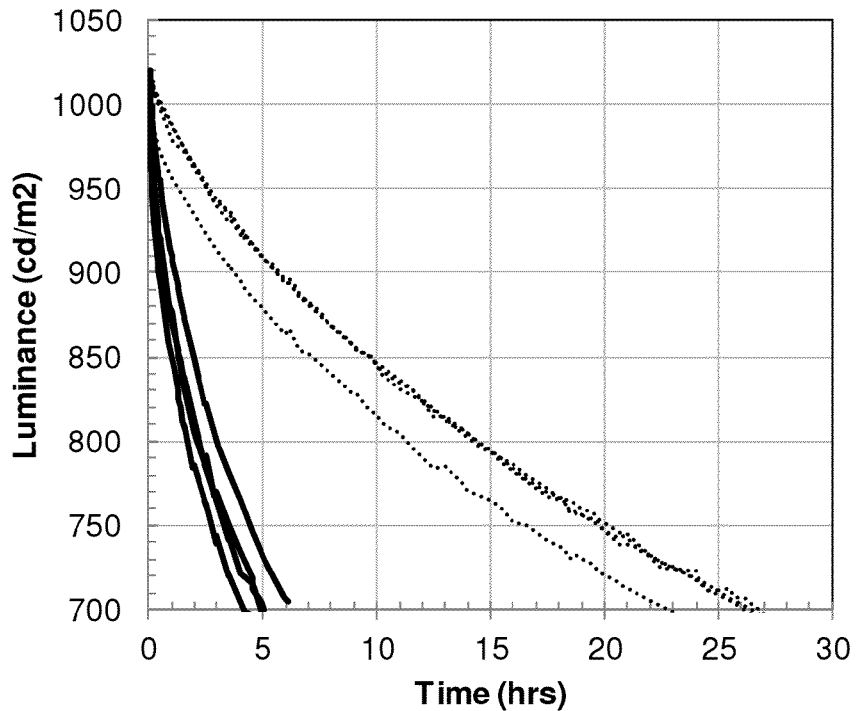
FIG. 3E shows plots of luminance vs. time for the two deviceS described with reference to FIG. 3A.

With reference to FIG. 3C, the device containing the Low T1 HTM has higher conductivity, which is attributed to the greater degree of conjugation of the Low T1 HTM. With reference to FIG. 3E, the half-life of the devices containing the Low T1 HTM (dotted lines) is also much longer than devices containing the High T1 HTM (solid lines) ("half-life" as used herein means the time taken for luminance of a device to fall to 50% of a starting brightness). However, with reference to FIG. 3D, devices containing the Low T1 HTM (dotted lines) suffers from significantly worse efficiency than devices containing the High T1 HTM (solid lines), which is attributed to quenching of phosphorescence by the Low T1 HTM.

Example 2

Emissive Hole-Transporting Layer Device

A device having a hole-transporting layer formed from a phosphorescent red emitting, low triplet energy hole-transporting polymer and a light-emitting layer containing green and blue phosphorescent materials was formed according to the General Device Process.

For the purpose of comparison, a comparative device having a hole-transporting layer formed from a non-emissive, low triplet energy hole-transporting polymer and a light-emitting layer containing red, green and blue phosphorescent materials was prepared according to the General Device Process.

The hole-transporting polymers used to form the hole-transporting layers of the comparative and exemplary devices were formed by Suzuki polymerisation as described in WO 00/53656 of monomers are set out in Table 2.

TABLE 2

| Emissive Hole-Transporting Polymer | Non-Emissive Hole-Transporting Polymer |
|---|---|
| Monomer 1, 50 mol % | Monomer 1, 50 mol % |
| Monomer 5, 36.516 mol % | Monomer 5, 36.516 mol % |
| Monomer 7, 10 mol % | Monomer 7, 10 mol % |
| Monomer 8, 3.484 mol % | Monomer 8, 2.884 mol % |
| Monomer 9, 1.2 mol % | — |
| (Phosphorescent red end-capping group) | |

The light-emitting layers of the exemplary device and the comparative device were formed from Host Polymer 2 doped with phosphorescent materials as set out in Table 3.

Host Polymer 2 was formed by Suzuki polymerisation as described in WO 00/53656 of the following monomers:

Monomer 10: 50 mol %

Monomer 11: 25 mol %

Monomer 12: 25 mol %

TABLE 3

| | Exemplary Device | | | Comparative Device | |
|---|---|---|---|---|---|
| Material | Weight % | LUMO (eV) | Material | | Weight % |
| Host Polymer 2 | 54 | −2.6 | Host Polymer 2 | | 53.7 |
| Blue Emitter 1 | 45 | −1.88 | Blue Emitter 1 | | 45 |
| Green Emitter 1 | 1 | −2.2 | Green Emitter 1 | | 1 |
| Red Emitter 2 | 0 | −2.49 | Red Emitter 2 | | 0.3 |

Figure 4A:
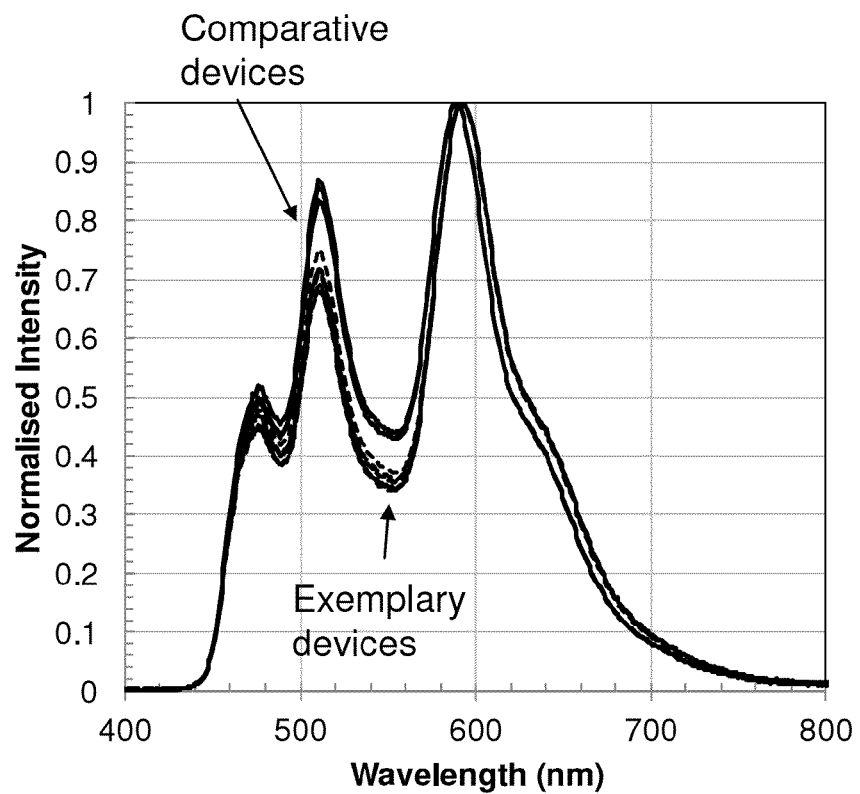
FIG. 4A shows the electroluminescent spectrum of an exemplary white-emitting OLED device having a hole-transporting layer containing a hole-transporting material having a low lowest excited triplet state and a red phosphorescent material and a second light-emitting layer containing green and blue phosphorescent materials, and the electroluminescent spectrum of a comparative device in which red, green and blue phosphorescent materials are all in the second light-emitting layer.
Figure 4B:
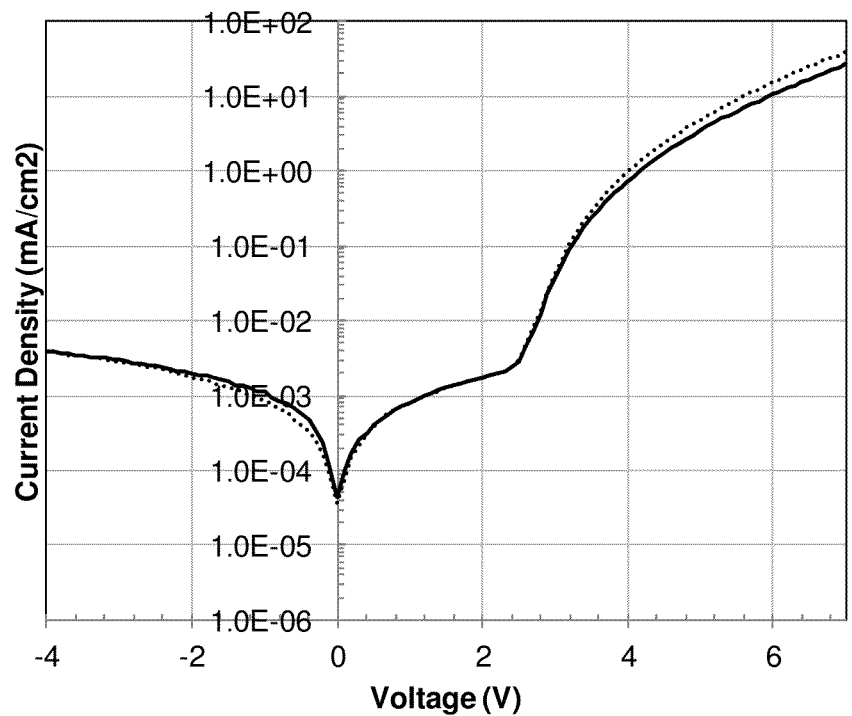
FIG. 4B shows plots of current density vs. voltage for the two devices described with reference to FIG. 4A.

With reference to FIGS. 4A and 4B, the electroluminescent spectra and conductivities of the exemplary device and the comparative device are similar.

Figure 4C:
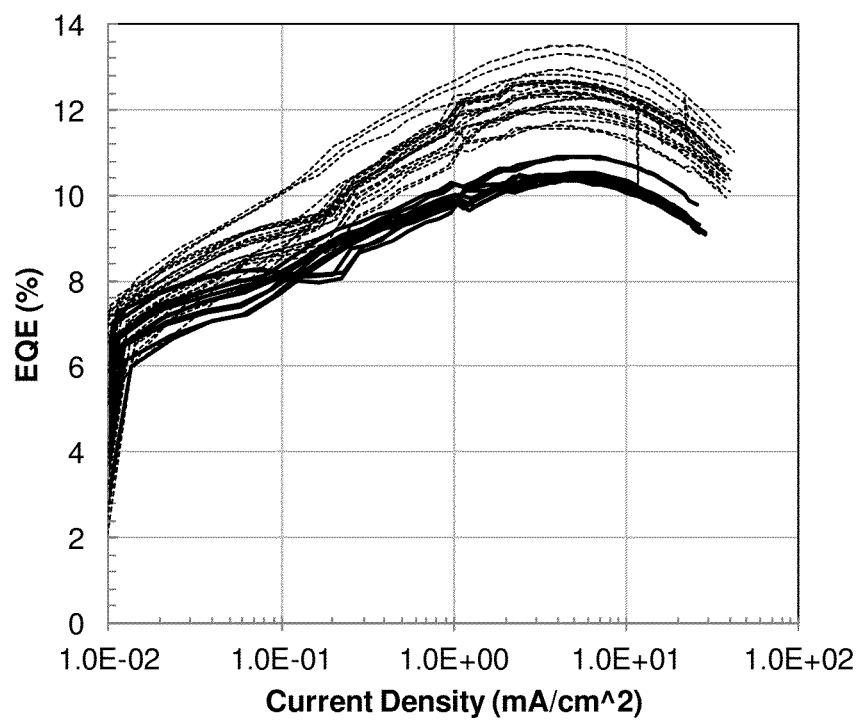
FIG. 4C shows plots of external quantum efficiency vs. luminance for the two devices described with reference to FIG. 4A.

With reference to FIG. 4C the external quantum efficiencies of the exemplary devices (dotted lines) are higher than those of the comparative device (solid lines). Without wishing to be bound by any theory, it is believed that triplets migrating into the low triplet energy hole-transporting layer are non-radiatively quenched in the case of the comparative device, but have a radiative decay path in the case of the exemplary device due to the presence of the phosphorescent red emitter unit of the hole-transporting polymer.

Figure 4D:
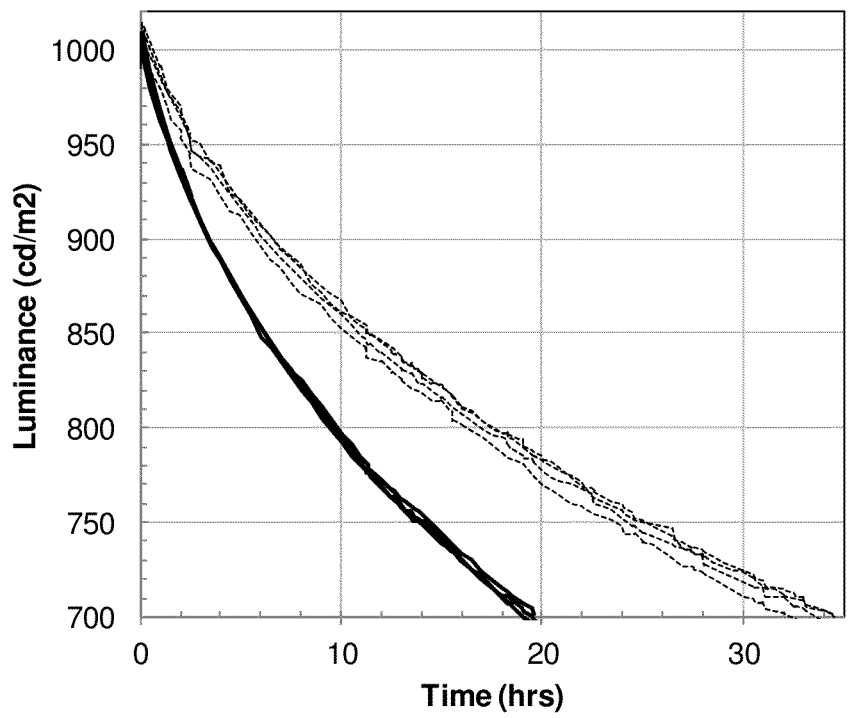
FIG. 4D shows plots of luminance vs. time for the two devices described with reference to FIG. 4A.

With reference to FIG. 4D the half-lives of the exemplary devices (dotted lines) is much higher than those of the comparative devices (solid lines).

The presence of a phosphorescent material in the low triplet energy hole-transporting layer of this example provides both longer lifetime and higher efficiency than a device in which all phosphorescent materials are provided in a single layer.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. An organic light-emitting device comprising an anode; a cathode; a first light-emitting layer between the anode and the cathode; and a second light-emitting layer between the first light-emitting layer and the cathode, wherein:
   the first light-emitting layer comprises a hole-transporting material and a first phosphorescent material,
   the second light-emitting layer comprises a second phosphorescent material; and
   the lowest triplet excited state energy level of the hole-transporting material is: (a) lower than the lowest triplet excited state of the second phosphorescent material, and (b) the same as or higher than the lowest triplet excited state energy level of the first phosphorescent material,
   wherein, the second light-emitting layer comprises a third phosphorescent material.

2. An organic light-emitting device according to claim 1 wherein the first phosphorescent material has a photoluminescent spectrum with a peak in the range of about more than 550 nm up to 700 nm.

3. An organic light-emitting device according to claim 1 wherein the second phosphorescent material has a photoluminescent spectrum with a peak in the range of about greater than 490 nm up to about 560 nm.

4. An organic light-emitting device according to claim 1 wherein the third phosphorescent material has a photoluminescent spectrum with a peak in the range of up to about 490 nm.

5. An organic light-emitting device according to claim 1 wherein the lowest triplet excited state energy level of the third phosphorescent material is higher than the lowest triplet excited state energy level of the hole-transporting material.

6. An organic light-emitting device according to claim 1 wherein the second light-emitting layer comprises a host material.

7. An organic light-emitting device according to claim 1 wherein the first phosphorescent material is covalently bound to the hole-transporting material.

8. An organic light-emitting device according to claim 7 wherein the hole-transporting material is a polymer having a polymer backbone and the first phosphorescent material is provided as a repeat unit in the polymer backbone, as a substituent of a repeat unit in the polymer backbone or as an end-capping unit at an end of the polymer backbone.

9. An organic light-emitting device according to claim 1 wherein the device emits white light.

10. An organic light-emitting device according to claim 1 wherein substantially all light emitted by the device is phosphorescent light.

11. An organic light-emitting device according to claim 1 wherein the hole-transporting material has a lowest excited state triplet energy level that is higher than the lowest excited state triplet energy level of the first phosphorescent material.

12. An organic light-emitting device comprising an anode; a cathode; a first light-emitting layer between the anode and the cathode; and a second light-emitting layer between the first light-emitting layer and the cathode, wherein:
   the first light-emitting layer comprises a hole-transporting material and a first phosphorescent material,
   the second light-emitting layer comprises a second phosphorescent material; and
   the lowest triplet excited state energy level of the hole-transporting material is: (a) lower than the lowest triplet excited state of the second phosphorescent material, and (b) the same as or higher than the lowest triplet excited state energy level of the first phosphorescent material,
   wherein the first phosphorescent material has a LUMO level that is further from vacuum than the LUMO level of any material of the second light-emitting layer.

13. An organic light-emitting device according to claim 12 wherein the first phosphorescent material has a LUMO level that is at least 0.1 eV further from vacuum than the LUMO level of any material of the second light-emitting layer.

14. An organic light-emitting device according to claim 13 wherein the first phosphorescent material has a LUMO level that is in the range of 0.05-0.30 eV further from vacuum than the LUMO level of any material of the second light-emitting layer.

15. A method of forming an organic light-emitting device comprising an organic light-emitting device comprising an anode; a cathode; a first light-emitting layer between the anode and the cathode; and a second light-emitting layer between the first light-emitting layer and the cathode, wherein:
   the first light-emitting layer comprises a hole-transporting material and a first phosphorescent material,
   the second light-emitting layer comprises a second phosphorescent material; and
   the lowest triplet excited state energy level of the hole-transporting material is: (a) lower than the lowest triplet excited state of the second phosphorescent material, and (b) the same as or higher than the lowest triplet excited state energy level of the first phosphorescent material, comprising the steps of:
   forming the first light-emitting layer over the anode; forming the second light-emitting layer on the first light-emitting layer; and forming the cathode over the second light-emitting layer;
   wherein the second light-emitting layer is formed by depositing a formulation comprising the second phosphorescent material and one or more solvents on the first light-emitting layer and evaporating the one or more solvents.

16. A method according to claim 15 wherein the first light-emitting layer is formed by depositing a formulation comprising the hole-transporting material, the first phosphorescent material and one or more solvents over the anode, and evaporating the one or more solvents.

17. A method according to claim 15 wherein the first light-emitting layer is crosslinked prior to formation of the second light-emitting layer.

* * * * *